United States Patent
Casparian et al.

(10) Patent No.: US 9,791,941 B2
(45) Date of Patent: *Oct. 17, 2017

(54) KEYBOARD WITH USER CONFIGURABLE GRANULARITY SCALES FOR PRESSURE SENSITIVE KEYS

(71) Applicant: Dell Products L.P., Round Rock, TX (US)

(72) Inventors: Mark A. Casparian, Miami, FL (US); Frank C. Azor, Palmetto Bay, FL (US)

(73) Assignee: Dell Products LP, Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/956,899

(22) Filed: Dec. 2, 2015

(65) Prior Publication Data

US 2016/0085315 A1 Mar. 24, 2016

Related U.S. Application Data

(63) Continuation of application No. 12/316,703, filed on Dec. 16, 2008, now Pat. No. 9,246,487.

(51) Int. Cl.
*G06F 1/16* (2006.01)
*G06F 3/02* (2006.01)
(Continued)

(52) U.S. Cl.
CPC ......... *G06F 3/0202* (2013.01); *H01H 13/702* (2013.01); *H01H 13/7065* (2013.01); *H03K 17/975* (2013.01); *H01H 2201/036* (2013.01); *H01H 2205/002* (2013.01); *H01H 2215/004* (2013.01); *H01H 2225/03* (2013.01); *H01H 2239/006* (2013.01)

(58) Field of Classification Search
CPC ..................................................... G06F 3/0202
USPC ........................................................... 341/34
See application file for complete search history.

(56) References Cited

U.S. PATENT DOCUMENTS 3,786,429 A 1/1974 Goldman et al.
3,936,674 A 2/1976 Hughes
(Continued)

OTHER PUBLICATIONS

Casparian et al., "Systems and Methods for Lighting Spring Loaded Mechanical Key Switches" U.S. Appl. No. 14/013,603, filed Aug. 29, 2013, DELL:169, Response to Office Action mailed Dec. 14, 2015, 22 pgs.

(Continued)

*Primary Examiner* — Amine Benlagsir
(74) *Attorney, Agent, or Firm* — Egan, Peterman, Enders & Huston LLP.

(57) ABSTRACT

Systems and methods are disclosed for user configurable pressure sensitive keys and techniques for controlling these keys for keyboards. User configuration information, including information for user configurable granularity scales for pressure levels, can be communicated from a host system to the keyboard and stored for later use by a keyboard controller to control the operation of the pressure sensitive keys. In this way, greater control of the pressure sensitive keys can be provided. This configurability is of particular use for applications such as where the keyboard is being used for gaming by a user running a gaming application on an information handling system.

18 Claims, 6 Drawing Sheets

(51) Int. Cl.
*H01H 13/702* (2006.01)
*H03K 17/975* (2006.01)
*H01H 13/7065* (2006.01)

(56) References Cited

U.S. PATENT DOCUMENTS

| | | | |
|---|---|---|---|
| 4,291,201 A | 9/1981 | Johnson et al. | |
| 4,302,011 A | 11/1981 | Pepper, Jr. | |
| 4,303,811 A | 12/1981 | Parkinson | |
| 4,334,134 A | 6/1982 | Janda | |
| 4,449,024 A | 5/1984 | Stracener | |
| 4,527,250 A | 7/1985 | Galdun et al. | |
| 4,628,785 A | 12/1986 | Buchia | |
| 4,660,019 A | 4/1987 | Bauer et al. | |
| 4,733,590 A | 3/1988 | Watanabe | |
| 4,849,852 A | 7/1989 | Mullins | |
| 4,850,591 A * | 7/1989 | Takezawa | A63F 13/06 463/37 |
| 4,896,069 A | 1/1990 | Rosenberg et al. | |
| 4,899,631 A | 2/1990 | Baker | |
| 4,977,298 A | 12/1990 | Fujiyama | |
| 5,220,318 A | 6/1993 | Staley | |
| 5,252,798 A | 10/1993 | Kamada | |
| 5,285,037 A | 2/1994 | Baranski et al. | |
| 5,389,757 A | 2/1995 | Souliere | |
| 5,408,060 A | 4/1995 | Muurinen | |
| 5,434,566 A * | 7/1995 | Iwasa | H01H 13/84 341/34 |
| 5,450,078 A | 9/1995 | Silva et al. | |
| 5,508,719 A | 4/1996 | Gervais | |
| 5,512,722 A | 4/1996 | Ozeki et al. | |
| 5,646,587 A | 7/1997 | Miyazawa et al. | |
| 5,691,716 A | 11/1997 | Crowley | |
| 5,736,976 A | 4/1998 | Cheung | |
| 5,909,211 A | 6/1999 | Combs et al. | |
| 6,007,209 A | 12/1999 | Pelka | |
| 6,102,802 A | 8/2000 | Armstrong | |
| 6,135,886 A | 10/2000 | Armstrong | |
| 6,275,138 B1 | 8/2001 | Maeda | |
| 6,313,762 B1 | 11/2001 | Crowley | |
| 6,400,285 B1 | 6/2002 | Gifford | |
| 6,417,845 B1 | 7/2002 | Chen et al. | |
| 6,559,399 B2 | 5/2003 | Hsu et al. | |
| 6,563,434 B1 | 5/2003 | Olodort et al. | |
| 6,608,271 B2 | 8/2003 | Duarte | |
| 6,617,982 B1 | 9/2003 | Ogata et al. | |
| 6,684,166 B2 | 1/2004 | Bellwood et al. | |
| 6,747,226 B2 | 6/2004 | Watanabe | |
| 6,747,867 B2 | 6/2004 | Hsu | |
| 6,758,615 B2 | 7/2004 | Monney et al. | |
| 6,860,612 B2 | 3/2005 | Chiang et al. | |
| 6,882,291 B2 | 4/2005 | Ogata et al. | |
| 6,883,985 B2 | 4/2005 | Roberson | |
| 6,885,364 B1 | 4/2005 | Ogata et al. | |
| 6,918,677 B2 | 7/2005 | Shipman | |
| 7,059,790 B2 | 6/2006 | Risheq | |
| 7,064,682 B2 | 6/2006 | Fedigan | |
| 7,084,787 B2 | 8/2006 | Olodoft et al. | |
| 7,106,305 B2 | 9/2006 | Rosenberg | |
| 7,123,241 B2 | 10/2006 | Bathiche | |
| 7,129,854 B2 | 10/2006 | Arneson et al. | |
| 7,196,640 B2 | 3/2007 | Fedigan | |
| 7,244,898 B2 | 7/2007 | Kim | |
| 7,256,768 B2 | 8/2007 | Bathiche | |
| 7,335,844 B2 | 2/2008 | Lee et al. | |
| 7,394,033 B2 | 7/2008 | Kim | |
| 7,541,946 B2 | 6/2009 | Fedigan | |
| 7,655,901 B2 | 2/2010 | Idzik et al. | |
| 7,667,371 B2 | 2/2010 | Sadler et al. | |
| 7,688,310 B2 | 3/2010 | Rosenberg | |
| 7,741,979 B2 | 6/2010 | Schlosser et al. | |
| 7,772,987 B2 | 8/2010 | Shows | |
| 7,786,395 B2 | 8/2010 | Ozias et al. | |
| 8,159,461 B2 | 4/2012 | Martin et al. | |
| 8,217,892 B2 | 7/2012 | Meadors | |
| 8,224,391 B2 | 7/2012 | Kim et al. | |
| 8,307,222 B2 | 11/2012 | Wang et al. | |
| 8,411,029 B2 | 4/2013 | Casparian et al. | |
| 8,502,094 B2 | 8/2013 | Chen | |
| 8,760,273 B2 | 6/2014 | Casparian et al. | |
| 2002/0021285 A1 | 2/2002 | Leman | |
| 2002/0070921 A1 | 6/2002 | Feldman | |
| 2002/0084721 A1 | 7/2002 | Walczak | |
| 2002/0109613 A1 | 8/2002 | Crowley et al. | |
| 2003/0072595 A1 | 4/2003 | Al-Safar | |
| 2003/0122779 A1* | 7/2003 | Martin | G06F 1/1662 345/156 |
| 2003/0210233 A1 | 11/2003 | Frulla | |
| 2004/0027385 A1 | 2/2004 | Rekimoto et al. | |
| 2004/0104893 A1* | 6/2004 | Huang | G06F 3/0238 345/168 |
| 2004/0174200 A1 | 9/2004 | McNutt | |
| 2004/0183783 A1 | 9/2004 | Rojas et al. | |
| 2004/0246149 A1 | 12/2004 | Fedigan | |
| 2005/0057514 A1 | 3/2005 | Bathiche | |
| 2005/0057515 A1 | 3/2005 | Bathiche | |
| 2005/0058492 A1 | 3/2005 | Hirsch | |
| 2005/0073446 A1 | 4/2005 | Lazaridis et al. | |
| 2005/0083215 A1 | 4/2005 | Crowley et al. | |
| 2005/0104751 A1 | 5/2005 | Tsai et al. | |
| 2005/0168447 A1 | 8/2005 | Caine et al. | |
| 2005/0174260 A1 | 8/2005 | Arneson et al. | |
| 2006/0022951 A1 | 2/2006 | Hull | |
| 2006/0066570 A1 | 3/2006 | Trifilo | |
| 2006/0148564 A1 | 7/2006 | Herkelman | |
| 2006/0158275 A1 | 7/2006 | Fedigan | |
| 2006/0227015 A1 | 10/2006 | Fedigan | |
| 2006/0255971 A1 | 11/2006 | Kim | |
| 2006/0277466 A1 | 12/2006 | Anderson | |
| 2007/0065215 A1 | 3/2007 | Brown | |
| 2007/0227256 A1 | 10/2007 | Wright | |
| 2007/0229455 A1 | 10/2007 | Martin et al. | |
| 2007/0235307 A1 | 10/2007 | Liao et al. | |
| 2007/0285393 A1 | 12/2007 | Ishakov | |
| 2008/0001787 A1 | 1/2008 | Smith et al. | |
| 2008/0018200 A1 | 1/2008 | Vogeley et al. | |
| 2008/0024454 A1 | 1/2008 | Everest | |
| 2008/0092087 A1 | 4/2008 | Brown et al. | |
| 2008/0144333 A1 | 6/2008 | Gourlay | |
| 2008/0159799 A1 | 7/2008 | Bender et al. | |
| 2008/0179172 A1 | 7/2008 | Sellers | |
| 2008/0251364 A1 | 10/2008 | Takala et al. | |
| 2008/0309631 A1* | 12/2008 | Westerman | G06F 1/3203 345/173 |
| 2009/0002201 A1 | 1/2009 | Crowley et al. | |
| 2009/0007758 A1 | 1/2009 | Schlosser et al. | |
| 2009/0079612 A1 | 3/2009 | Parfitt | |
| 2009/0127084 A1 | 5/2009 | Ozias et al. | |
| 2009/0140985 A1 | 6/2009 | Liu | |
| 2009/0178913 A1 | 7/2009 | Peterson et al. | |
| 2009/0189790 A1 | 7/2009 | Peterson et al. | |
| 2009/0189873 A1 | 7/2009 | Peterson et al. | |
| 2009/0207055 A1 | 8/2009 | Aull et al. | |
| 2009/0210568 A1 | 8/2009 | Peterson et al. | |
| 2009/0267892 A1 | 10/2009 | Faubert | |
| 2009/0267920 A1 | 10/2009 | Faubert et al. | |
| 2009/0278792 A1 | 11/2009 | Toebes et al. | |
| 2010/0027854 A1 | 2/2010 | Chatterjee et al. | |
| 2010/0040400 A1 | 2/2010 | Hirsch | |
| 2010/0089735 A1 | 4/2010 | Takeda et al. | |
| 2010/0090813 A1 | 4/2010 | Je et al. | |
| 2010/0090814 A1 | 4/2010 | Cybart et al. | |
| 2010/0090957 A1 | 4/2010 | Idzik et al. | |
| 2010/0117809 A1 | 5/2010 | Dai et al. | |
| 2010/0134420 A1 | 6/2010 | Gluckstad | |
| 2010/0148999 A1 | 6/2010 | Casparian et al. | |
| 2010/0182241 A1 | 7/2010 | Rosenberg | |
| 2010/0205803 A1 | 8/2010 | Lipton et al. | |
| 2010/0252407 A1 | 10/2010 | Merminod et al. | |
| 2010/0253552 A1 | 10/2010 | Mendez et al. | |
| 2010/0288607 A1 | 11/2010 | Ozias et al. | |
| 2010/0321301 A1 | 12/2010 | Casparian et al. | |
| 2011/0078470 A1 | 3/2011 | Wang et al. | |
| 2011/0095877 A1 | 4/2011 | Casparian et al. | |

(56) References Cited

U.S. PATENT DOCUMENTS

| | | |
|---|---|---|
| 2011/0102325 A1 | 5/2011 | Sato et al. |
| 2011/0102326 A1 | 5/2011 | Casparian et al. |
| 2011/0102340 A1 | 5/2011 | Martin et al. |
| 2011/0278147 A1 | 11/2011 | Lee et al. |
| 2011/0285555 A1 | 11/2011 | Bocirnea |
| 2012/0298491 A1 | 11/2012 | Ozias et al. |
| 2013/0067126 A1 | 3/2013 | Casparian et al. |
| 2013/0100028 A1 | 4/2013 | Mahowald et al. |
| 2013/0178292 A1 | 7/2013 | Casparian et al. |
| 2014/0105664 A1 | 4/2014 | Hoyos |
| 2014/0226302 A1 | 8/2014 | Shih et al. |
| 2014/0253454 A1 | 9/2014 | Caldwell |
| 2015/0061901 A1 | 3/2015 | Casparian et al. |
| 2015/0061902 A1 | 3/2015 | Casparian et al. |

OTHER PUBLICATIONS

Texas Instruments, "MSP430 Capacitive Single-Touch Sensor Design Guide", Application report, SLAA379, Jan. 2008, 19 pgs.
Cypress Semiconductor Corporation, Cypress Perform, "*CY8C21634, CY8C21534, CY8C21434, CY8C21334, CY8C2123; PSoC® Mixed-Signal Array,*" Apr. 18, 2008, Document No. 38-12025 Rev. M, 43 pgs.
Logitech, "Logitech Gaming Keyboard G510", Printed from Internet Aug. 25, 2011, 3 pgs.
Saitek, "Saitek Pro Gamer Command Unit", Feb. 27, 2011, 7 pgs.
Saitek, "Saitek Pro Gamer Command Unit", Dec. 6, 2005, 41 pgs.
Casparian et al., Keyboard With User Configurable Granularity Scales for Pressure Sensitive Keys, DELL:111, U.S. Appl. No. 12/316,703, Office Action, Feb. 27, 2012; 13 pgs.
Casparian et al., Keyboard With User Configurable Granularity Scales for Pressure Sensitive Keys, DELL:111, U.S. Appl. No. 12/316,703, Response, May 29, 2012; 15 pgs.
Casparian et al., Keyboard With User Configurable Granularity Scales for Pressure Sensitive Keys, DELL:111, U.S. Appl. No. 12/316,703, Final Office Action, Aug. 2, 2012; 22 pgs.
Casparian et al., "Systems and Methods for Implementing Haptics for Pressure Sensitive Keyboards", DELL:132, U.S. Appl. No. 12/930,125, Office Action, Aug. 9, 2012; 16 pgs.
Casparian et al., "Systems and Methods for Implementing Pressure Sensitive Keyboards", DELL:124, U.S. Appl. No. 12/802,468, Office Action, Oct. 23, 2012; 14 pgs.
Casparian et al., "Keyboard With User Configurable Granularity Scales for Pressure Sensitive Keys", DELL:111, U.S. Appl. No. 12/316,703, RCE and Amendment, Nov. 2, 2012, 19 pgs.
Casparian et al., "Systems and Methods for Implementing Haptics for Pressure Sensitive Keyboards", DELL:132, U.S. Appl. No. 12/930,125, Response to Office Action, Nov. 9, 2012; 23 pgs.
Casparian et al., "Systems and Methods for Implementing Haptics for Pressure Sensitive Keyboards", DELL:132, U.S. Appl. No. 12/930,125, Final Office Action, Jan. 2, 2013; 22 pgs.
Casparian et al., "Systems and Methods for Implementing Pressure Sensitive Keyboards", DELL:124, U.S. Appl. No. 12/802,468, Amendment, Jan. 23, 2013, 17 pgs.
Casparian et al., "Systems and Methods for Implementing Haptics for Pressure Sensitive Keyboards", DELL:132, U.S. Appl. No. 12/930,125, Amendment, Mar. 1, 2013, 26 pgs.
Casparian et al., "Systems and Methods for Implementing Haptics for Pressure Sensitive Keyboards", DELL:132, U.S. Appl. No. 12/930,125, Advisory Action, Apr. 3, 2013, 9 pgs.
Casparian et al., "Systems and Methods for Implementing Pressure Sensitive Keyboards", DELL:124, U.S. Appl. No. 12/802,468, Final Office Action, Apr. 9, 2013, 21 pgs.
Casparian et al., "Systems and Methods for Implementing Pressure Sensitive Keyboards", DELL:124, U.S. Appl. No. 12/802,468, Response to Final Office Action, Jun. 10, 2013, 13 pgs.
Casparian et al., "Systems and Methods for Implementing Pressure Sensitive Keyboards", DELL:124, U.S. Appl. No. 12/802,468, Advisory Action, Jul. 11, 2013, 7 pgs.
Casparian et al., "Systems and Methods for Implementing Pressure Sensitive Keyboards", DELL:124, U.S. Appl. No. 12/802,468, filed Jun. 8, 2010, RCE and Amendment, Aug. 12, 2013, 25 pgs.
Cherry Corporation, MX Series Key Switch, Obtained From Internet Aug. 12, 2013, 9 pgs.
Cherry Corporation, Keymodule MX, Obtained from Internet Jul. 25, 2013, 2 pgs.
The Keyboard Company, An Introduction to Cherry MX Mechanical Switches, Obtained from Internet Jul. 25, 2013, 7 pgs.
Zhang et al., Systems and Methods for Intelligent System Profile Unique Data Management:, DELL:152, U.S. Appl. No. 13/618,666, filed Sep. 14, 2012, 32 pgs.
Casparian et al., "Systems and Methods for Implementing Spring Loaded Mechanical Key Switches With Variable Displacement Sensing", DELL:167, U.S. Appl. No. 14/013,724, filed Aug. 29, 2013, 57 pgs.
Casparian et al., "Apparatus and Methods for Mounting Haptics Actuation Circuitry in Keyboards", DELL:133; U.S. Appl. No. 12/930,118, filed Dec. 29, 2010, Office Action, Oct. 4, 2013, 21 pgs.
Casparian et al., "Systems and Methods for Implementing a Multi Function Mode for Pressure Sensitive Sensors and Keyboards", DELL:143, U.S. Appl. No. 13/232,707, filed Sep. 14, 2011, Office Action, Jul. 29, 2013, 15 pgs.
Casparian et al., "Systems and Methods for Implementing Haptics for Pressure Sensitive Keyboards", DELL:132C1; U.S. Appl. No. 14/044,331, filed Oct. 2, 2013, 87 pgs.
Casparian et al., "Systems and Methods for Implementing a Multi Function Mode for Pressure Sensitive Sensors and Keyboards", DELL:143, U.S. Appl. No. 13/232,707, filed Sep. 14, 2011, Amendment, Nov. 26, 2013, 19 pgs.
Casparian et al., "Systems and Methods for Implementing Haptics for Pressure Sensitive Keyboards", DELL:132C1; U.S. Appl. No. 14/044,331, filed Oct. 2, 2013, Preliminary Amendment; 22 pgs.
Casparian et al., "Systems and Methods for Implementing Haptics for Pressure Sensitive Keyboards", DELL:132C1; U.S. Appl. No. 14/044,331, filed Oct. 2, 2013, Third Preliminary Amendment; Dec. 16, 2013, 23 pgs.
Casparian et al., "Apparatus and Methods for Mounting Haptics Actuation Circuitry in Keyboards", DELL:133, U.S. Appl. No. 12/930,118, filed Dec. 29, 2010, Amendment, Dec. 27, 2013, 19 pgs.
Casparian et al., "Systems and Methods for Implementing Haptics for Pressure Sensitive Keyboards", DELL:132, U.S. Appl. No. 12/930,125, filed Dec. 29, 2010, Amendment, Dec. 27, 2013, 23 pgs.
Casparian et al., "Keyboard With User Configurable Granularity Scales for Pressure Sensitive Keys", U.S. Appl. No. 12/316,703, filed Dec. 16, 2008, Office Action dated Apr. 23, 2014, 29 pgs.
Casparian et al., "Keyboard With User Configurable Granularity Scales for Pressure Sensitive Keys", U.S. Appl. No. 12/316,703, filed Dec. 16, 2008, Response to Office Action dated Jul. 23, 2014, 19 pgs.
Casparian et al., "Keyboard With User Configurable Granularity Scales for Pressure Sensitive Keys", U.S. Appl. No. 12/316,703, filed Dec. 16, 2008, Office Action dated Nov. 10, 2014, 29 pgs.
Casparian et al., "Systems and Methods for Implementing Haptics for Pressure Sensitive Keyboards", U.S. Appl. No. 14/044,331, filed Oct. 2, 2013, Office Action dated Sep. 29, 2014, 58 pgs.
Casparian et al., "Systems and Methods for Implementing Haptics for Pressure Sensitive Keyboards", U.S. Appl. No. 14/044,331, filed Oct. 2, 2013, Response to Office Action filed Dec. 23, 2014, 29 pgs.
Casparian et al., "Keyboard With User Configurable Granularity Scales for Pressure Sensitive Keys", U.S. Appl. No. 12/316,703, filed Dec. 16, 2008, Response to Office Action dated Feb. 10, 2015, 22 pgs.
Casparian et al., "Systems and Methods for Implementing Haptics for Pressure Sensitive Keyboards", U.S. Appl. No. 14/404,331, filed Oct. 2, 2013, Office Action dated Apr. 22, 2015, 68 pgs.
Casparian et al., "Keyboard With User Configurable Granularity Scales for Pressure Sensitive Keys", U.S. Appl. No. 12/316,703, filed Dec. 16, 2008, Final office action dated May 27, 2015, 34 pgs.

(56) References Cited

OTHER PUBLICATIONS

Casparian et al., "Systems and Methods for Implementing Haptics for Pressure Sensitive Keyboards", U.S. Appl. No. 14/404,331, filed Oct. 2, 2013, Response to Office Action dated Jul. 22, 2015, 26 pgs.
Casparian et al., "Keyboard With User Configurable Granularity Scales for Pressure Sensitive Keys", U.S. Appl. No. 12/316,703, filed Dec. 16, 2008, Response to Final office action filed Jul. 27, 2015, 11 pgs.
Casparian et al., "Systems and Methods for Implementing Haptics for Pressure Sensitive Keyboards", U.S. Appl. No. 14/044,331, filed Oct. 2, 2013, DELL:132C1, Advisory Action mailed Aug. 6, 2015, 8 pgs.
Casparian et al., "Systems and Methods for Implementing Haptics for Pressure Sensitive Keyboards", U.S. Appl. No. 14/044,331, filed Oct. 2, 2013, DELL:132C1, Amendment filed Aug. 24, 2015, 29 pgs.
Casparian et al., "Systems and Methods for Implementing Spring Loaded Mechancial Key Switches With Variable Displacement Sensing", U.S. Appl. No. 14/013,724, filed Aug. 29, 2013, DELL:167, Office Action mailed Aug. 25, 2015, 9 pgs.
Casparian et al., "Systems and Methods for Lighting Spring Loaded Mechanical Key Switches" U.S. Appl. No. 14/013,603, filed Aug. 29, 2013, DELL:169, Office Action mailed Sep. 14, 2015, 23 pgs.
Casparian et al., "Systems and Methods for Implementing Spring Loaded Mechancial Key Switches With Variable Displacement Sensing", U.S. Appl. No. 14/013,724, filed Aug. 29, 2013, DELL:167, Response to Office Action filed Nov. 25, 2015, 21 pgs.
Casparian et al., "Systems And Methods For Lighting Spring Loaded Mechanical Key Switches", Office Action dated May 26, 2017, Filed May 16, 2016, U.S. Appl. No. 15/155,660; 48 pgs.

* cited by examiner

KEYBOARD WITH USER CONFIGURABLE GRANULARITY SCALES FOR PRESSURE SENSITIVE KEYS

This application is a continuation of pending U.S. patent application Ser. No. 12/316,703, filed on Dec. 16, 2008 and entitled "Keyboard With User Configurable Granularity Scales For Pressure Sensitive Keys" the entire disclosure of which is incorporated herein by reference.

TECHNICAL FIELD

The techniques described herein relate to systems and methods for keyboards and, more particularly, for keyboards for host systems running gaming applications.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems use keyboards to obtain user input. Some prior keyboard solutions have provided pressure sensitive keys. The most common technique to provide pressure sensitive keys is to use variable resistance sensing techniques to provide an indication of the pressure applied by a user to a key. Variable capacitance sensing has also been utilized in some prior art products such as console gamepad controllers. While pressure sensitive buttons have been used before, improved techniques and control of pressure sensitive keys are still needed, particularly for gaming keyboards.

SUMMARY

Systems and methods are disclosed for user configurable pressure sensitive keys and techniques for controlling these keys for keyboards. User configuration information, including information for user configurable granularity scales, can be communicated from a host system to the keyboard and stored for later use by a keyboard controller to control the operation of the pressure sensitive keys. In this way, greater control of the pressure sensitive keys can be provided. This configurability is of particular use for applications such as where the keyboard is being used for gaming by a user running a gaming application on an information handling system. As described below, other features and variations can be implemented, as desired, and a related methods and systems can be utilized, as well.

DESCRIPTION OF DRAWINGS

It is noted that the appended drawings illustrate only example embodiments of the techniques described herein and are, therefore, not to be considered limiting of its scope, for the invention may admit to other equally effective embodiments.

DETAILED DESCRIPTION OF THE INVENTION

Figure 1:
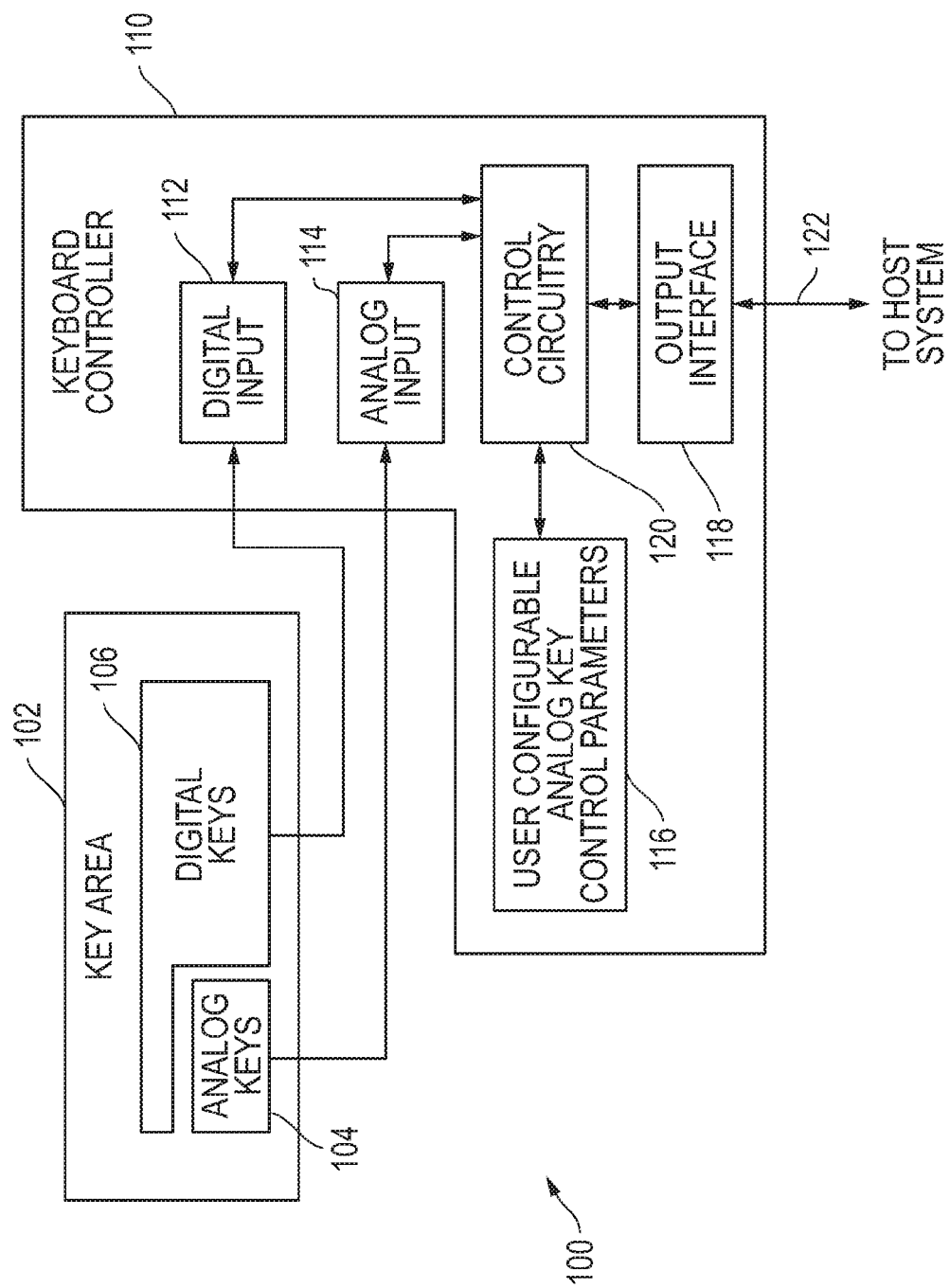
FIG. 1 is a block diagram for a keyboard system including pressure sensitive or analog keys and user control of same.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server computer system, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

As described herein, systems and methods provide pressure sensitive keys and techniques for controlling these keys for keyboards. User configuration information, including information for user configurable granularity scales, can be communicated from a host system to the keyboard and stored for later use by a keyboard controller to control the operation of the pressure sensitive keys. In this way, greater control of the pressure sensitive keys can be provided. This configurability is of particular use for applications such as where the keyboard is being used for gaming by a user running a gaming application on an information handling system. In particular, the user can configure the granularity scale for each pressure sensitive key so that each key can provide a desired gaming response. In addition, different configuration files can be stored so that a user can select and use different configurations for different games and/or different users can select and use different configurations based upon their personal preferences.

As described below, keyboards typically use rubber dome based keys that provide a momentary-on switch contact via a make-or-break contact with two layers of flex PCB (printed circuit board) with a raw exposed conductor pad on both layers that come into contact with one another upon a key press. In gaming applications, gamers typically use the W, A, S, and D keys for travel movements (forward, left, backward, right respectively); Q and E keys are typically used for strafing left and right respectively; and the spacebar key is used for jumping, although gaming keys are not restricted to these particular keys or functions. Rather than tapping a button a few times to make a gradual turn, or several rapid taps to make a sharp turn, it is more natural for a user to apply more pressure on the A or D keys to pull a tighter turn and/or turn with gradual or sharpness of turn desired proportionally to the amount of finger pressure applied to the respective keyboard key. Such capability is not only more intuitive, but allows the user easier granular control over game play input such as gradually turning/sharp turn, variable speed of travel movement (slow walk, spring), the rate of fire of a gun, variable degree of the amount of strafing to the left or right, but not limited to these examples. The advantageous solutions described herein provide a unique ability to use pressure sensitive keys and user configurable granularity scales for these pressure sensitive keys to allow enhanced user control of how keys respond in a gaming application and/or any other desired application.

There are many kinds of game genres. The features and ways to utilize variable pressure control vary from game to game or from genre to genre. For example, in a first person shooter (FPS) game, a particular variable pressure button may be used to control the speed of fire (single shot, multiple shots, faster multiple shots, machine gun rapid fire). For real-time strategy games, the variable finger pressure sensitivity of the key may mean something completely different. With a variety of game genres, and even within a particular genre, there are many game titles, where the user will want to save their keyboard's pressure sensitive button definitions in a profile for the game, even with the ability to categorize by game genre. It is also desirable to allow the user to configure how the pressure sensitive button should work. For example, the user may want the full range of gradual variable control. In another instance, the user may want this button to act like a momentary on/off switch button. In still another instance, the user may want the button to operate as four (4) possible positions (e.g., slow walk, fast walk, jog, sprint) depending on the amount of pressure applied by the finger. This user configuration information, and this user configurable granularity control in particular, as described below, can be communicated to and stored by the keyboard to provide the user this capability of configuring how the keyboard pressure sensitive keys will operate.

The keyboard embodiments described herein have from one to all of their keys controlled via pressure-sensitive sensors, such as variable conductance or variable capacitance sensors. As described in more detail below, an injection molded rubber dome sheet and flex circuitry can be used to accommodate both pressure sensitive keys and traditional momentary-on switch based keys. A keyboard microcontroller can take inputs from both analog and digital inputs. An analog block front-end to the keyboard microcontroller can be used to accommodate pressure-sensitive sensors that have analog outputs. A typical 24-bit digital pathway can also be used from the keyboard array to the keyboard's microcontroller for any momentary-on keys. Typically, a keyboard microcontroller has three dedicated 8-bit digital input ports to take in this data, though it need not be limited to this.

Current keyboards use rubber-dome momentary-on switches. The key cap has a rod or "chimney stack" on its bottom side. There is also a nipple or actuator on the bottom side of the rubber dome. As the user presses down on the key cap, the chimney stack presses down on the rubber dome, which in turn presses the nipple/actuator down on the flex circuitry beneath it. This pressing motion brings flex circuitry from one signal layer in direct contact with flex circuitry in a second signal layer. As a result, the two connections make contact, signaling to the microcontroller that the key has been pressed (the momentary-on signal). These rubber-dome momentary-on switches can be used for the non-pressure sensitive keys for the keyboards described herein.

For the pressure sensitive keys, the embodiments described herein can be configured to use rubber dome keys with conductive half-spheres or half-domes located on the underside of the rubber domes. The embodiments can use the following principle: as the conductive sphere is pressed harder against a printed circuit board (PCB) or flexible PCB underneath it, the conductive sphere's surface area contact increases with pressure, thus increasing the capacitance of that contact in relationship with a nearby charged trace. The capacitance can be measured, converted to a digital stream, and sent to a microcontroller. The embodiments, therefore, can use analog-based variable-pressure keys and incorporate them with digitally based momentary-on switches of typical keyboards to make a keyboard that supports both regular make/break keys and keys with variable finger pressure sensitivity. This variable finger pressure sensitivity is particularly useful for gaming applications where there is a consistent need for more intuitive gaming interfaces.

For keyboards with both types of keys, a mixed signal input can be provided to the keyboard microcontroller via both an analog input block and a digital input block. The digital input to the microcontroller can be provided by the typical keyboard array of momentary-on switches. These are the keys that operate as either switch on or off, essentially providing a digital 1 or 0 back to the microcontroller. An analog block front-end can also be provided for analog or variable pressure inputs to the keyboard microcontroller. Many microcontrollers are made today with programmable analog input blocks. These programmable microcontrollers allow a circuit designer to select the analog functions performed in this analog block—such as analog-to-digital conversion, comparator function, capacitive touch sensing, etc.—for use with analog keys. Such an analog block also allows embodiments herein to accommodate a few different pressure-sensitive sensor implementations—allowing the designer to make a change from one method to another depending on test results of the range of variability, effect of drift over time, effect of the conductance of the conductive actuator with age, effect of temperature over time, etc. This analog block may be either embedded or integrated within the microcontroller, external to the microcontroller, or a combination of both embedded and external. It is noted that any key or keys within the keyboard may be designed to be pressure sensitive and attach to this analog input.

As previously mentioned, the analog block may be programmed to perform different analog functions depending on the sensing methodology. For example, if the designer selected the variable capacitance method of pressure sensing, one would design the analog block such as to measure the capacitance associated with the respective pressure-sensitive key, convert it to a digital value and have the microcontroller read it. Should the designer decide to select a variable resistance methodology, the analog block could be designed to use an analog-to-digital converter coupled to the pressure-sensitive sensor/keycap to convert an analog signal stream to a digital stream (i.e., 6-bit, 8-bit or 10-bit stream) and have it read by the microcontroller. The designer can also select any key or keys from the keyboard to be supported via pressure-sensing through scalability of the analog front end through a combination of embedded and external analog circuitry. At the same time, the keyboard microcontroller can also support any number of digitally based momentary-on switch based keys.

As stated above, the analog input block can be embedded or integrated within the microcontroller, though it could also be located external to the microcontroller as well. The pressure sensitive keys, for example, can provide their analog input to analog input pins of the microcontroller. Examples of microcontrollers including integrated analog front-end blocks include an integrated circuit from Cypress Semiconductor having part number CY8C24794 and an integrated circuit from Silicon Laboratories having part number C8051F320. Again, the momentary-on switch based key's input can be sent via a 24-bit digital path to the digital inputs of the microcontroller. The microcontroller can also have an embedded I2C master/slave block used to talk to peripheral ICs (integrated circuits) for additional functionality. A serial EEPROM can also be provided as part of the keyboard to communicate with the keyboard microcontroller, for example, to provide the VID (vendor identification) and DID (device identification) information to the microcontroller via the I2C bus.

It is further noted that for an electronic lighting control embodiment where aspects of key lighting are implemented for the keyboard, a combination pulse width modulator (PWM) and LED (light emitting diode) driver integrated circuit can be used, such as part number MAX6964AEG available from Maxim. Such integrated circuits, for example, can receive commands from a host system, such as a personal computer, through the keyboard controller to drive RGB (red, green, blue) LEDs for keyboard lighting as instructed by the host system. The personal computer or host system, for example, can be configured to communicate with the keyboard controller through a USB connection, and the keyboard controller can be configured to convert these commands into a serial I2C stream provided to the PWM and LED driver integrated circuit which can in turn pulse width modulate the correct amount of light dimming and color to be provided for the keyboard lighting.

As described further below, to form the analog and digital keys, a common injection-molded silicon rubber sheet can be used with built in rubber domes and a common flex circuitry to support both digital momentary-on switches and analog based pressure sensitive sensors (e.g., variable resistance or variable capacitance). Variable capacitance sensing, variable resistance sensing or some other variable technique can be used for the pressure sensitive keys. For variable capacitance sensing, as the user's finger applies pressure to the plastic keycap, it can be configured to press on the depressible rubber dome which has a conductive spherical shaped actuator on the bottom side. As the key cap is pressed, the conductive spherical shaped actuator comes into contact with one plate of a capacitor. An insulating layer is located above a second plate for the capacitor so that it is isolated from the first plate. Thus, the conductive actuator does not contact the second plate, and a capacitance develops between the two plates. As the user puts more pressure onto the keycap, more conductive material from the conductive actuator will lie over first plate thereby increasing the capacitance between the two plates. To measure the capacitance change, two traces from the capacitor (one from each plate) can be sent to the analog input block which reads the capacitance and converts it from an analog signal to a digital signal that can be read by the microcontroller. The conductive material for the capacitive actuator may either be impregnated into the rubber dome material, or may be an external piece of material that is attached to the rubber dome via mechanical/snap-in means, via adhesive, or a hot fusing method. Other methods for providing a conductive and flexible actuator can also be used.

In operation of the keyboard, the amount of finger pressure applied by a user to a key can be determined and reported to the microcontroller. Advantageously, as described herein, the microcontroller can use configuration information provided by a user to adjust the operation of the pressure sensitive keys. This user configuration, for example, can adjust the sensitivity and output levels generated by the keyboard controller based upon the pressure sensitive signals received with respect to the pressure sensitive keys. The keyboard controller can then in turn provide output signals to the host system that indicate pressure amounts. The host computer can then use these keyboard output signals with respect to particular software application functions being operated by the host computer. For gaming applications, such pressure sensitive functions may include the variability in the speed of travel (slow walk, trot, run, etc.), the amount of turning (slow, fast, etc.), the amount of strafing (single shot, multi-shot, rapid shot, etc.) for a first-person-shoot game, the amount of braking for a vehicle race game, the degree of the rate of fire, the height of one's jump, and/or any other desired variable gaming feature.

Figure 2:
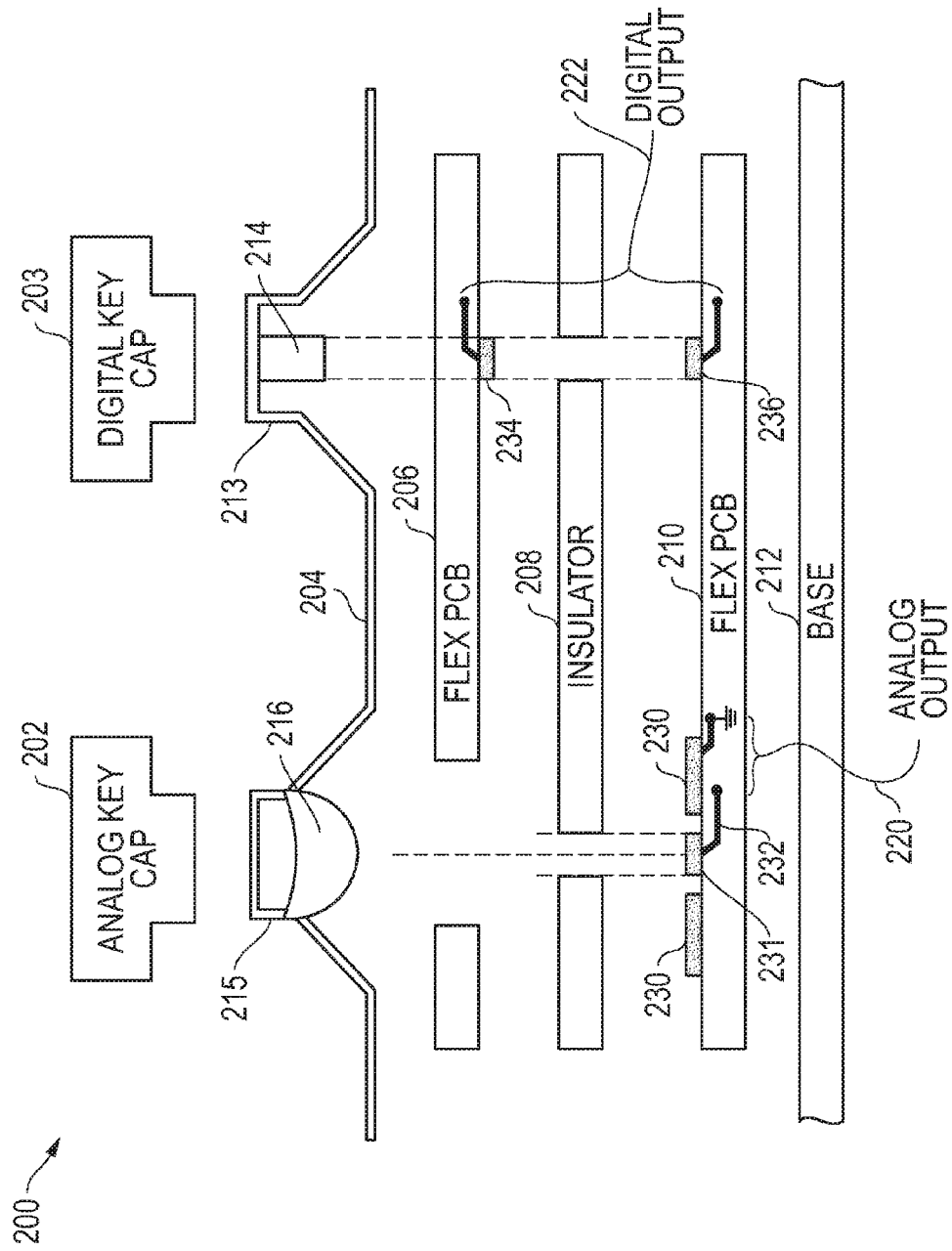
FIG. 2 is a diagram for a structure having both an analog key and a digital key.
Figure 4:
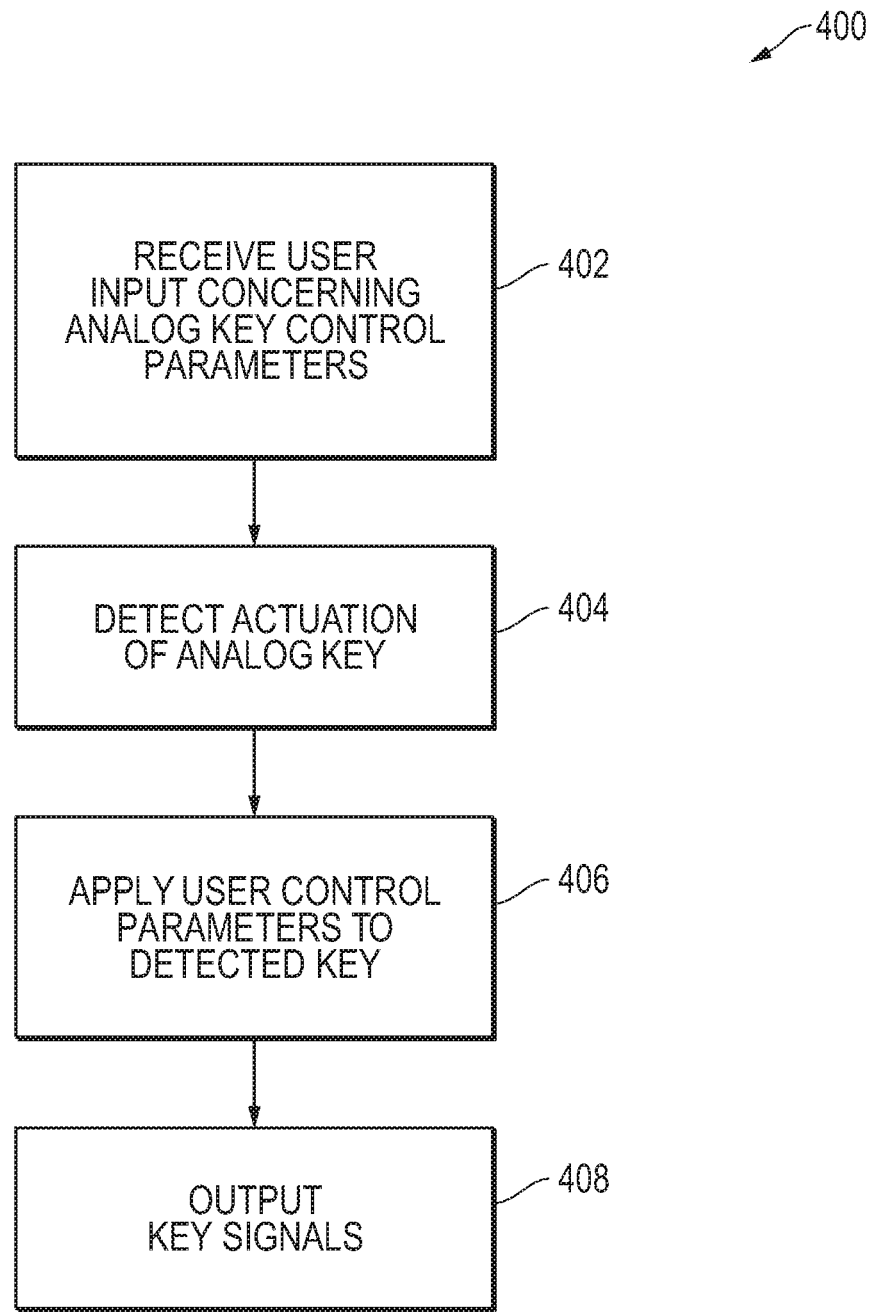
FIG. 4 is a flow diagram for using user input parameters for controlling analog keys.
Figure 5:
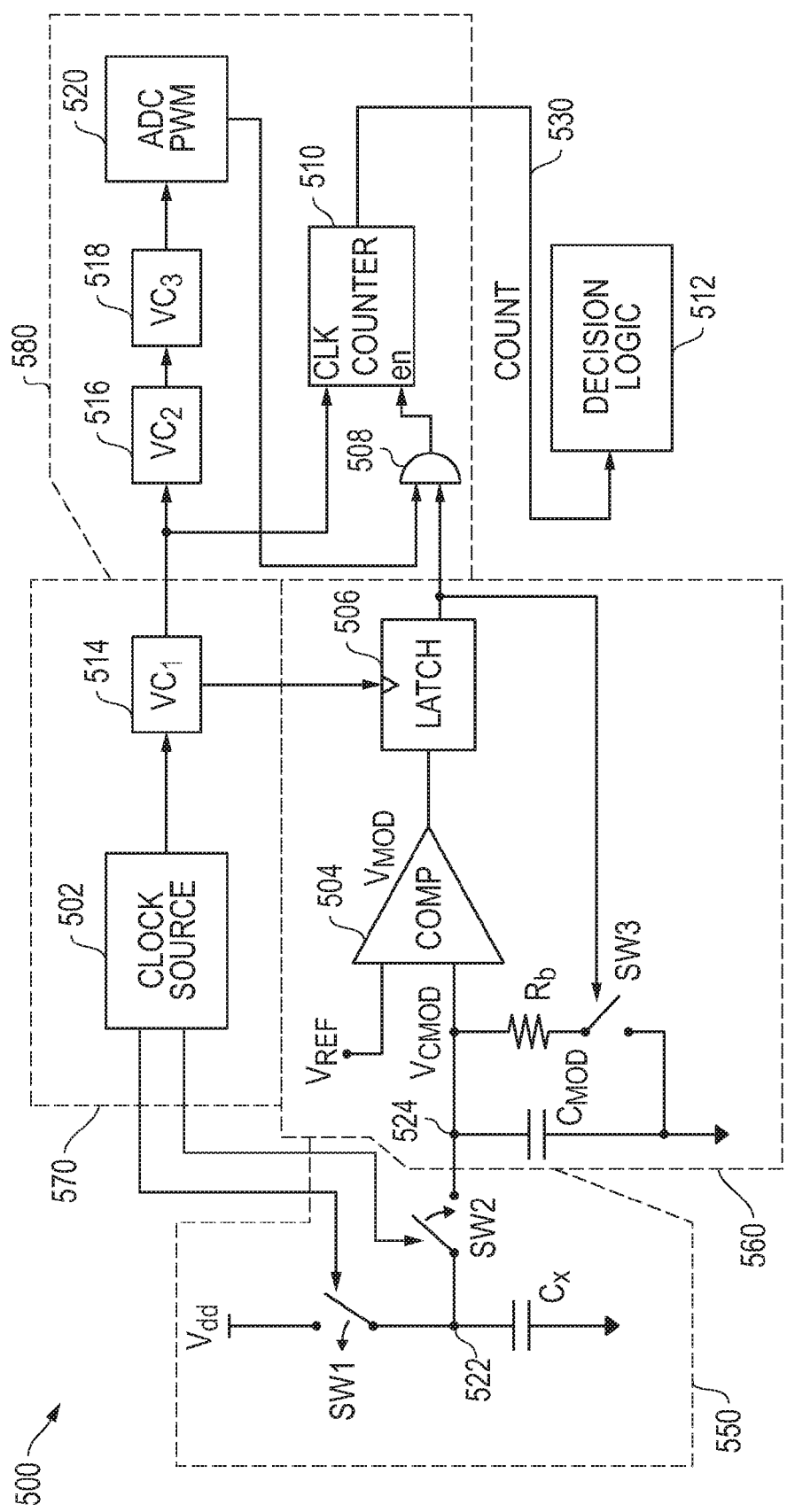
FIG. 5 is a circuit diagram for an embodiment of capacitance detection circuitry that provides an output count to decision logic.

The embodiments will now be described in more detail with respect to the drawings. FIG. 1 describes a system including variable keys. FIG. 2 shows an example structure for variable keys. FIGS. 3A, 3B, 3C and 3D provide examples for the operation of the pressure sensitive keys. FIG. 4 is a flow diagram for user configuration of the variable keys. And FIG. 5 provides a circuit diagram for detecting capacitive sensitive keys.

FIG. 1 is a block diagram for a keyboard system 100 including pressure sensitive or analog keys and user control of same. As depicted, a keyboard controller 110 is coupled to a key area 102 that is part of a keyboard device body. The key area 102 includes analog keys 104 and digital keys 106. The digital keys 106 represent keys that are detected as either depressed or not depressed. When a digital key is depressed, an output signal is sent to the digital input block 112 within the keyboard controller 110. The analog keys 104 represent keys that are detected as being depressed by a variable amount or with a variable amount of pressure. When an analog key is depressed, an indication of the force or extent to which it is depressed is provided to the analog input block 114 within the keyboard controller 110. As noted above, the digital input block 112 and the analog input block 114 can be integrated within a microcontroller that is operating as the keyboard controller 110, if desired. The digital input block 112 and the analog input block 114 could also be implemented with external circuitry, as well.

The control circuitry 120 within the keyboard controller 110 is coupled to receive on/off signals from the digital input block 112 and variable or pressure sensitive signals from the analog input block 114. The control circuitry 120 processes this key information and is connected to an output communication interface 118 so that this key information can be communicated to external devices, such as a host system, through communication path 122. In addition, external devices can communicate control and/or other configuration information to the keyboard controller though this same output communication interface 118 through communication path 122. User configuration information that can be communicated to the keyboard controller includes user configurable analog key control parameters 116 that can stored by the keyboard controller for use by the control circuitry 120 in processing the key related signals received from the digital input block 112 and the analog input block 114 by the keyboard controller 110.

It is noted that the output communication interface 118 and communication path 122 can take a variety of forms. The communication path 122 can be a wired communication path or a wireless communication path, as desired. With respect to personal computer systems, such as desktop computers and laptop computers, the output communication interface 118 will often be a Bluetooth interface if a wireless interface is desired and will often be a USB (universal serial bus) interface if a wired interface is desired. However, it is again noted that any desired communication interface can be utilized. It is further noted that the keyboard controller 110 and the control circuitry 120 can be implemented as a microcontroller that runs firmware stored on a memory device associated with the keyboard controller 110 and/or control circuitry 120. It is also noted that the user configuration information can be stored in random access memory (RAM) or other memory storage that is associated with the keyboard controller 112 (either internally or externally).

The configurable analog key control parameters 116 can be stored on the keyboard and can provide a wide variety of configurable parameters that can be adjusted by a user through the output interface 118. The user configuration information may be stored, for example, in nonvolatile or volatile memory on board the keyboard system 100. In addition, a single and/or multiple different user configuration files may be stored allowing a user to select the applicable or desired keyboard configuration file depending on the game or application being used by the user and/or depending upon the particular user using the keyboard at the time. In other words, each different user can create his/her own configuration file that can be selected by each user based upon his/her personal preferences. In addition, a particular user can create a plurality of different configuration files that can be selected for use by the user depending upon the game/application being used by the user at the time. This advantageous configurability allows a single user to quickly switch analog key parameters when the user switches between different games. And this configurability allows multiple users to share the same keyboard system and still have individual key parameter profiles. Thus, one or more users can advantageously access, modify and store different configuration files, including granularity scales for the pressure sensitive keys, through the output interface 118. It is further noted that while it is preferred that the configuration files be stored in memory on the keyboard system 100 as the configurable analog key control parameters 116, it is also possible for these configuration files to first be stored on the host system and then transferred to memory on the keyboard itself when used.

FIG. 2 is a diagram for an embodiment 200 for key structures including an analog key and a digital key. In operation, depressing the analog key cap 202 causes a variable or analog output 220 to be provided by the keyboard, and depressing digital key cap 203 causes a digital or on/off output 222 to be provided by the keyboard. The analog keys provide a variable output, and the digital keys provide a momentary-on output. As depicted, the embodiment 200 has a layered structural approach that is similar to prior techniques except for the use of pressure sensitive keys, such as the capacitive key with a conductive and flexible half-dome structure 216 that is depicted in FIG. 2. This conductive and flexible half-dome structure 216 has advantageous operational benefits as described below.

In the layered structure, a base 212 represents the bottom of the layered structure and can be made of a material that can support the key structure, such as a hard plastic material. A flexible PCB (printed circuit board) 210 is then provided on top of the base 212. The PCB 210 includes circuit traces or connections that provide for electrical signals to be generated and communicated when keys are depressed. For example, circuit connection 236 is used to provide digital output 222, and circuit connection pads 230 and 231 are used to provide the analog output 220. The next layer is flexible insulator 208, such as a flexible PCB without circuit connections. The next layer is another flexible PCB 206 that can include circuit traces or connections that work in conjunction with the connections on PCB 210 to provide for electrical signals to be generated and communicated when keys are depressed. For example, circuit connection 234 is used to provide the digital output 222. A relatively thin flexible layer 204 can then be provided above PCB 206 and can be made from an injection molded silicon rubber sheet. This flexible layer 204 is configured to have a molded flexible rubber dome for each key. For example, flexible dome 215 is provided for analog key cap 202, and flexible dome 213 is provided for digital key cap 203.

For the digital key, an actuator 214 is also provided underneath the dome 213 that causes circuit trace 234 to be engaged with circuit trace 236 when the digital key cap 203 is depressed. When circuit trace 234 touches the circuit trace 236, a signal is now active indicating the key was pressed, causing a digital output 222 to be generated. This digital output 222 can be configured to provide a momentary-on indication of whether or not the key has been depressed. The digital key cap 203 can be made from hard plastic.

For the analog key, a conductive and flexible half-dome 216 is provided that flexes when depressed, as described in more detail below, to vary the capacitance associated between circuit pad 231 and circuit pad 230 when analog key cap 202 is depressed. Essentially pad 231 and pad 230 are the two plates of a capacitor. The variable capacitance between these two plates are measured from signal trace 232 by sending this trace to capacitance reading circuitry. As stated below, pad 230 can be coupled to ground. It is noted that the conductive and flexible half-dome 216 can be made, for example, from a conductive rubber material, that is conductive, flexible and capable of reforming its shape after being depressed and released. Prior art techniques have made this material from a carbon impregnated rubber.

As shown in more detail with respect to FIG. 3B described below, electrical pad 230 is shaped like a donut with an insulative material in the middle. Circuit trace 232 connects to the circuit pad 231 through a via within the insulative material with the conductive pad 231 being located in the middle of the insulative center of the donut area. Pad 230 may be attached to a signal trace, but the preferred method of embodiment has pad 230 being coupled to a given charge, such as being attached to ground. Due to insulator layer 208, the conductive half-dome 216 may only make contact to circuit pad 231 through the hole in the insulator 208.

As described further below, as the conductive and flexible half-dome 216 makes contact with circuit pad 231 and is deformed by pressure from the analog key cap 202, the capacitance between pad 231 and pad 230 increases. As more pressure is applied to the analog key cap 202, the half-dome 216 gradually deforms and flattens-out on top of the insulator, causing a larger conductive surface area to run parallel to pad 230. Effectively, there are two parallel plates provided by pads 231 and 230 with a fixed thickness insulator/dielectric between them. Pad 230 has a fixed surface area as it is printed onto the PCB 210. However, pad 231 has a variable surface area or is a variable sized parallel plate due to the action of half-dome 216 as it is depressed. As the surface area of pad 231 gradually increases due to action of half-dome 216 as greater force is applied to the analog key cap 202, the capacitance between plates 231 and 230 gradually increases as well. This variable capacitance can be sensed, measured and used as an indication of the pressure being applied to the analog key cap 202.

The advantage of the variable capacitance methodology over variable resistance is that the sensor is implemented on the PCB directly. For variable resistance methods, a sensor material is required per key that changes impedance when touched. This adds to the keyboard's BOM (build of materials) cost. It also reduces a source of variability of touch performance from PCB to PCB due to the variance of the impedance of printed traces or of the tolerance to passive resistors or other resistive materials used.

In addition to providing pressure sensitive capacitive keys to generate a variable indication of how hard a key has been depressed, the embodiments described herein also provide for unique and advantageous techniques for user configurable control of these pressure sensitive keys. An example for user configuration of these pressure sensitive keys, and user configuration of the granularity scale for these pressure sensitive keys, is now described in further detail with respect to FIGS. 3A, 3B, 3C and 3D.

Figure 3A:
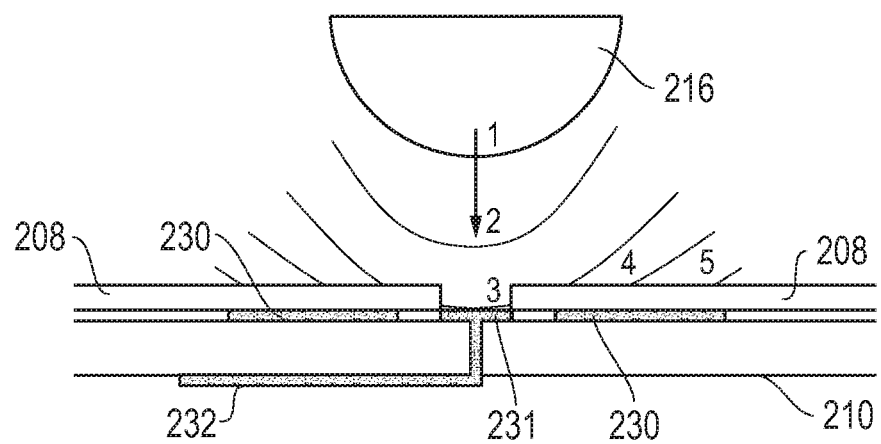
FIG. 3A is a diagram for different depressed states for a half-dome structure.

FIG. 3A is a diagram for different depressed states for the conductive and flexible half-dome structure 216. In its initial state, the bottom edge of the half-dome structure 216 has a bottom edge position indicated by Line 1. As the key is depressed, the half-dome structure 216 will move through the gap in the PCB layer 206 (see FIG. 2) and down towards insulator 208 and connection pad 231 on PCB 210. Line 2 represents the bottom edge of half-dome structure 216 when it has been depressed some distance. Line 3 represents the bottom edge of half-dome structure 216 when it has been depressed far enough to touch connection pad 231 through the gap in insulator 208. It is also noted that bottom edge will have flattened out slightly due to this contact, as shown with respect to Line 3. Line 4 shows that the bottom edge of half-dome structure 216 will continue to flatten as it is depressed. And Line 5 is a further indication of this flattening of the half-dome structure 216. As stated above, as the half-dome structure 216 is moved closer to connection pad 231, half-dome structure 216 will touch connection pad 231 and will then flatten out causing a larger surface area for electrical plate 231 relative to electrical plate 230. As the surface area of the plate 231 increases due to increased pressure on analog keycap 202, the capacitance between pad 231 and pad 230 correspondingly increases. This change in capacitance ($\Delta C$) can be used as an indicator of the pressure that has been used to depress the key associated with the half-dome structure 216. As stated above, connection pad 231 can be coupled to an analog input block and control circuitry that operate to measure and process the electrical information provided from connection pad 231.

Figure 3B:
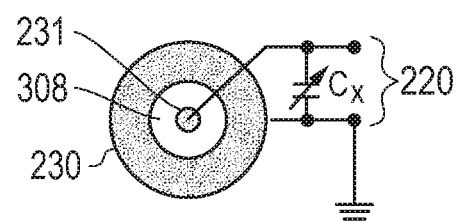
FIG. 3B is a diagram for a top view of the capacitive contacts for the half-dome structure.

FIG. 3B is a diagram for a top view of the capacitive contact pads 230 and 231 for the half-dome structure. As depicted, an insulative material 308 sits between the contact pad 230 and the contact pad 231. As indicated above, the contact pad 230 can be coupled to ground. And the variable capacitance (Cx) between the pads 230 and 231 caused by the motion of the half-dome structure 216 can be used to provide the analog output 220. The variable capacitance (Cx) between pads 230 and 231 can be represented by a fixed capacitance component associated with the position of the pads 230 and 231 ($C_{fixed}$) and a varying capacitance component ($C_{variable}$) associated with the action of the half-dome 216, such that $Cx=C_{fixed}+C_{variable}$. The deforming of the half-dome structure 216 effectively increases the capacitor plate area associated with the pad 230, thereby effectively increasing the capacitance between pads 230 and 231. As stated above, the change in capacitance ($\Delta C$) caused by varying capacitance component ($C_{variable}$) due to the half-dome 216 can be then used as an indicator of the pressure that has been used to depress the key associated with the half-dome structure 216.

One current method of capacitive sensing and measurement is through an analog-to-modulator circuit that provides capacitance sensing using a switched capacitor technique with a sigma-delta modulator to convert the sensing switched capacitor current to a digital "count" code. A counter-based digital filter converts the modulator output bit stream to a readable digital output—essentially a "count" output 530 from a timer/counter 510, as discussed below with respect to FIG. 5. According to the advantageous solutions provided herein, this count output 530 can be analyzed in decision logic 512 incorporated in firmware within a microcontroller. This firmware can be configured to run decision logic to determine the implied amount of force applied to the keycap based upon the count, and the decision logic can be based upon user configurable parameters as described herein.

Figure 3C:
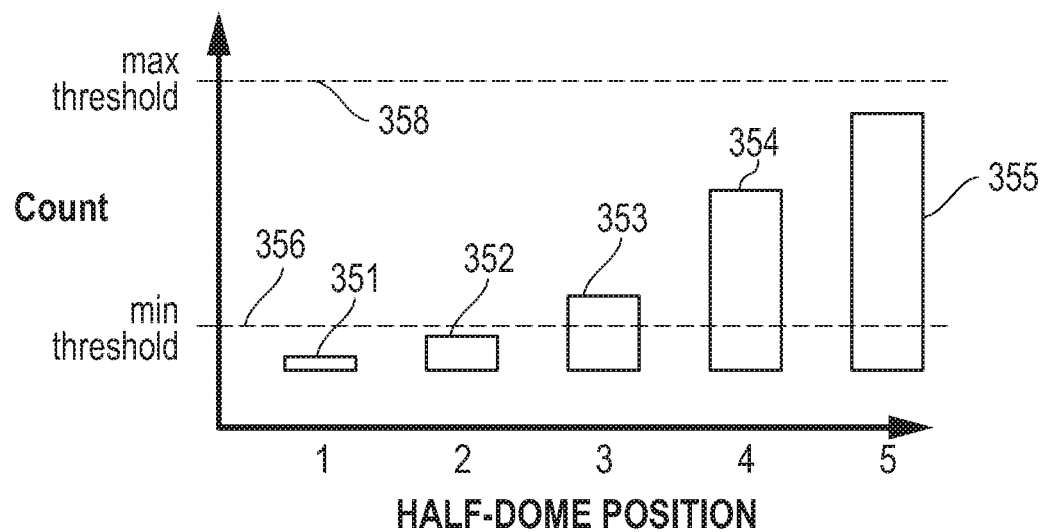
FIG. 3C is a diagram for different count determinations associated with the depressed states for FIG. 3A.

FIG. 3C is an example diagram for different count determinations associated with the depressed states for FIG. 3A. As indicated above, one possible detection method for the capacitive key is to provide a count associated with the amount of capacitance associated with the capacitive key. In the diagram of FIG. 3C, the x-axis represents the half-dome actuator positions indicated in FIG. 3A, and the y-axis represents a count produced to indicate the amount of capacitance associated with the capacitive key. Block 351 represents a count for the first position associated with Line 1. Block 352 represents a count for the second position associated with Line 2. It is noted that that the count or capacitance increases, even though the finger is not touching, due to a proximity effect of the finger capacitance and/or half-dome 216 relative to the pad 231. As such, this effect can be used as a proximity sensor. Block 353 represents a count for the third position associated with Line 3. This is the first time the finger causes the half-dome to touch pad 231. Block 354 represents a count for the fourth position associated with Line 4. And block 355 represents a count for the fifth position associated with Line 5.

Minimum and maximum threshold values can also be provided. The dotted line 356 is a minimum threshold count level that represents what count level is required to indicate that the analog key has been engaged. In other words, until this minimum count is reached, the keyboard system does not indicate that the key has been depressed at all. The dotted line 358 is a maximum threshold count level that represents the most that the key can be depressed. In other words, when this maximum count is reached, further pressure on the key will not affect how the keyboard system reports the amount that the key has been depressed. These minimum and maximum thresholds can be made programmable and user configurable through the output interface 118, as described further below with respect to FIG. 4.

Figure 3D:
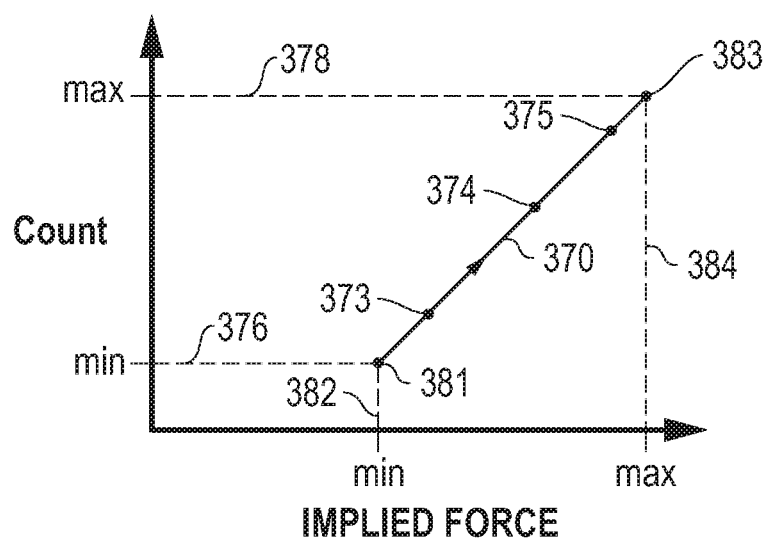
FIG. 3D is a diagram of implied force represented by detected counts.

FIG. 3D is a diagram of implied force represented by detected counts. The y-axis represents the count, and the x-axis represents the implied force based upon the count. The dotted line 378 represents the maximum effective count based upon the maximum threshold 358 indicated in FIG. 3C. This maximum effective count 378 then correlates to a maximum implied force as represented by dotted line 384. The dotted line 376 represents the minimum effective count based upon the minimum threshold 356 indicated in FIG. 3C. This minimum effective count 376 then correlates to a minimum implied force as represented by dotted line 382. The line 370 represents the relationship between counts and the implied force indicated by those counts. As depicted, the relationship is configured as a linear response between a minimum point 381 and a maximum point 383, although non-linear relationships could also be used, if desired. As the key is depressed more, the count will increase, and the implied force will increase. The implied force is a parameter that can be provided to the host system as an indication of how hard the key has been depressed. In correlation to FIG. 3C, point 373 represents an implied force associated with Line 3. Point 374 represents an implied force associated with Line 4. And point 375 represents an implied force associated with Line 5.

FIG. 4 is a flow diagram for using user configuration information or input parameters for controlling the effective end-result output from the analog or pressure sensitive key inputs. As indicated above, operational parameters associated with the analog keys can be user configurable, if desired. The process flow 400 provides an example for such user configuration. In block 402, the keyboard controller receives user configuration information providing user input concerning analog key control parameters. These user provided control parameters can then be stored for later use by the keyboard controller. In block 404, actuation of an analog key is detected. In block 406, the user control parameters are applied to the detected keys. Finally, in block 408, the keyboard controller outputs key signals associated with the depressed key.

Configurable features of the analog keys that can be adjusted by the user can include any of a variety of items. For example, the user can select or adjust the minimum and maximum threshold levels discussed with respect to FIG. 3C. These can be adjusted, for example, so that varying degrees of pressure on the analog key will result in different results for the implied force shown in FIG. 3D. This configurable feature can also allow the user to effectively switch the analog key from an on/off determination (i.e., pressed or not pressed) to a key that will output the amount of pressure being applied. Further, a user can be allowed to adjust the granularity scale or resolution in which the implied pressure is provided to external devices. In other words, the sensitivity of the analog key can be adjusted by the user.

This user configurable granularity scale for each pressure sensitive key provides a significant advantage in making the pressure sensitive keys useful for a wide variety of games, game play conditions and/or other applications. In this way, the user configures the number of different pressure levels that are indicated by the pressure sensitive keys. For example, if a large number of levels were desired, a user could select ten (10) positions between minimum to maximum for applied pressure thus outputting ten (10) positions or degrees of applied pressure. If a simple toggle control were desired, the user could select to just provide two (2) settings—essentially providing an indication of whether the button was pressed down or not (0 or 1)—similar to the function of a standard momentary-on key. In one embodiment, user configuration information can be configured to allow a user to select from between 2 and 10 levels for the granularity scale in providing the levels of pressure to be indicated by the pressure sensitive key. And this granularity scale can be separately controlled and selected by the user for each analog key, if desired, or the same granularity scale could be used for all of the pressure sensitive keys. Other examples could also be provided using granularity scales of applied pressure levels for the pressure sensitive keys configurable between at least 2 pressure levels to not more than 10 pressure levels. For example, configurable granularity scales between 2 pressure levels and 5 pressure levels could be provided. As would be understood, other variations could also be provided, and keys could be controlled individually or collectively, as desired.

As discussed above, in many first-person-shooter gaming applications, the WASD keys are used for movement, the QE keys are used for sliding, and the spacebar key is used for actions. With the keyboard described herein, each of these keys could provided as a pressure sensitive key, and the user could be allowed to select the granularity scale for each of these keys individually in one or more configuration files stored on the keyboard, as described herein. The gaming application could then interpret these different pressure levels as representing corresponding game action. This configurability, therefore, allows for greater flexibility in user control of game action and allows for an increased intuitive gaming experience. As a gaming example, the following settings in TABLE 1 and TABLE 2 represent a first configuration (CONFIG 1) and a second configuration (CONFIG 2) that could be set for a gaming application by one or more users. It is noted that for these two examples, the pressure levels represent the granularity scale for the pressure sensitive key with one level being a non-depressed condition. As such, two pressure levels represents an on/off key operation.

TABLE 1

EXAMPLE GRANULARITY SCALES - CONFIG 1

| Key | Granularity Scale Selection | Game Action |
|---|---|---|
| W | 5 pressure levels | no action, slow walk, fast walk, jog, sprint in forward movement |
| A | 4 pressure levels | no action, slow turn, medium turn, fast turn to the left |
| S | 5 levels | no action, slow walk, fast walk, jog, sprint in backward movement |
| D | 4 pressure levels | no action, slow turn, medium turn, fast turn to the right |
| Q | 3 pressure levels | no action, slow slide, fast slide to the left |
| E | 3 pressure levels | no action, slow slide, fast slide to the right |
| Spacebar | 4 pressure levels | no action, single shot, burst shot, continuous shot |

TABLE 2

EXAMPLE GRANULARITY SCALES - CONFIG 2

| Key | Granularity Scale Selection | Game Action |
| --- | --- | --- |
| W | 3 pressure levels | no action, walk, run in forward movement |
| A | 2 pressure level | no action, turn to the left |
| S | 3 levels | no action, walk, run in backward movement |
| D | 2 pressure level | no action, turn to the right |
| Q | 3 pressure levels | no action, slow slide, fast slide to the left |
| E | 3 pressure levels | no action, slow slide, fast slide to the right |
| Spacebar | 2 pressure levels | no action, shot |

FIG. 5 is a circuit diagram for an embodiment 500 of capacitance detection circuitry that provides an output count 530 to decision logic 512. As depicted, capacitance Cx represents the variable capacitance of connection pad 231 and is connected between node 522 and ground. A first switch (SW1) is connected between node 522 and voltage supply (Vdd). A second switch (SW2) is connected between node 522 and node 524. Capacitor $C_{MOD}$ is connected between node 524 and ground. Resistor Rb and a third switch (SW3) are connected in series between node 524 and ground. Node 524 represents voltage $VC_{MOD}$ and provides an input to a comparator (COMP) 504. The other input to comparator (COMP) 504 is a reference voltage $V_{REF}$. The output of comparator (COMP) 504 is provided to latch 506. The output of latch 506 is provided to AND gate 508, which in turn provides an output to the enable (EN) input of counter 510. The output of counter 510 provides a count (COUNT) 530 to decision logic 512.

Clock source 502 provides clocking for the embodiment 500. Clock signals are provided to control the first switch (SW1) and the second switch (SW2). In operation, these switches are controlled to provide switch capacitor operation. The first switch (SW1) will be closed to allow voltage to build up on node 522. After some period of time, the first switch (SW1) will be closed and stored voltage will be transferred to node 524 by closing the second switch (SW2). This voltage $V_{CMOD}$ is then provided to the comparator (COMP) 504. Clock 502 provides a clock signal to clock distribution block ($VC_1$) 514 that then provides a clock signal to latch 506 to latch the output of the comparator 504 and a clock signal to counter 510. The clock distribution block ($VC_1$) 514 also provides a signal to clock distribution blocks ($VC_2$) 516 and ($VC_3$) 518, which in turn provide an output to the analog-to-digital converter (ADC) pulse width modulator (PWM) block 520. The ADC PWM block 520 provides an output to AND gate 508.

It is noted that the portion of the circuitry within section 550 represents a switched capacitor block. The portion of the circuitry within section 560 represents a sigma delta modulator block. The portion of the circuitry within section 570 represents a clock block. And the portion of the circuitry within section 580 represents a modulator bitstream filter block.

In operation, switches SW1 and SW2 do not overlap and are not closed at the same time in operation. The current from sensing capacitor Cx flows to and charges capacitor $C_{MOD}$. When the voltage ($V_{CMOD}$) on the capacitor $C_{MOD}$ reaches reference voltage $V_{REF}$, the comparator (COMP) 504 toggles closing switch SW3 thus discharging resistor Rb. The capacitor voltage ($V_{CMOD}$) then starts to decrease. When this voltage decreases below the reference voltage $V_{REF}$, switch SW3 is opened thus disconnecting Rb. The capacitor voltage ($V_{CMOD}$) then starts to increase, repeating the charge/discharge cycle. The latch synchronizes the output of comparator (COMP) 504 to the clock signal from block ($VC_1$) 512. This operation keeps capacitor voltage ($V_{CMOD}$) close to $V_{REF}$ with the constant charge/discharge cycles keeping the voltage in check.

The modulator block 560 operates to convert the capacitance voltage from the switched capacitor block 550 to a bit stream duty cycle as measured by the counter 510. The counter 510 preserves its state when the modulator block 560 output is low and decrements by one when modulator block 560 output is high. Thus, as the capacitance of sensing capacitor $C_X$ increases, this results in an increase in the duty cycle for the modulator block 560. This results in a higher counter output count. Thus, the duty cycle output is linearly proportional to the sensing capacitance $C_X$. This makes applied force sensing implementable with this approach, as shown with respect FIG. 3D.

It is noted that various aspects of the embodiment 500 can be made configurable in order to adjust the operation of the count detection circuit that provides the count signal (COUNT) 530 to decision logic 512. For example, the reference voltage $V_{REF}$ and/or the clock signals can be made configurable to essentially adjust the sensitivity and operation of the count circuitry. It is further noted that the decision logic 512 can be programmable circuitry, such as a microcontroller running firmware stored in a memory device associated with the microcontroller. It is also noted that the embodiment 500 could be integrated on a single integrated circuit or could be implemented with multiple integrated circuits, as desired. Further, the embodiment 500 can be included as part of the keyboard controller 110 as shown in FIG. 1.

As indicated above, according to the advantageous solutions provided herein, the decision logic 512 can be implemented in firmware that is run by a microcontroller. The firmware can be configured to analyze the count and run decision logic to determine the implied amount of force on the keycap by positioning the sensing capacitance Cx along a scale from minimum capacitance to maximum capacitance. As such, the user can adjust, through a graphical user interface on the host system, the granularity scale or resolution of the number of positions from minimum to maximum capacitance or count. Other variations and features could also be provided, as desired, with respect to the user configuration information provided to the keyboard controller through the communication interface from the host system.

One integrated circuit that can be used to implement the embodiment 500 is a programmable system-on-chip (PSOC) integrated circuit available from Cypress Semiconductor having the designation CY8C21234. This PSOC integrated circuit includes a microcontroller with built-in switched capacitor blocks, a sigma delta analog-to-digital converter (one-bit converter) and a modulator bit stream filter. The microcontroller on this PSOC can also be programmed as desired. It is further noted that he CY8C21234 has firmware that compensates for changes in count output due to changes in temperature or voltage swings (e.g., Vdd and $V_{REF}$ in FIG. 5), thus helping to ensure reliable and repeatable count activity under various environmental conditions. The CY8C21234 can also communicate its output via one of two serial interfaces: an I2C interface or a serial port interface (SPI). If desired, the I2C interface for the CY8C21234 can be connected to an I2C-to-USB controller so that the CY8C21234 can interface directly to an external devices, such as a personal computer, using a USB port. One I2C-to-USB controller that can be used is an integrated circuit USB hub controller designated TUSB2140 and available from Texas Instruments.

Further modifications and alternative embodiments of the techniques described herein will be apparent to those skilled in the art in view of this description. It will be recognized, therefore, that the techniques described herein are not limited by these example arrangements. Accordingly, this description is to be construed as illustrative only and is for the purpose of teaching those skilled in the art the manner of carrying out the techniques described herein. It is to be understood that the forms of the techniques described herein shown and described are to be taken as the presently preferred embodiments. Various changes may be made in the implementations and architectures. For example, equivalent elements may be substituted for those illustrated and described herein and certain features of the techniques described herein may be utilized independently of the use of other features, all as would be apparent to one skilled in the art after having the benefit of this description of the techniques.

What is claimed is:

1. A keyboard, comprising:
   a keyboard device body including a plurality of pressure sensitive keys within the keyboard device body configured to provide pressure sensitive signals;
   an output communication interface within the keyboard device body configured to be coupled to a separate external host system device outside of the keyboard device body to allow communication between the keyboard device body and the external host system through the output communication interface;
   a memory within the keyboard device body configured to store one or more configuration files;
   at least one configuration file of the configuration files stored within the memory within the keyboard device body, the configuration file including user configuration information for the pressure sensitive keys including a plurality of granularity scales of multiple different applied pressure levels to be indicated from the keyboard device body to the external host system device outside the keyboard device body for the pressure sensitive keys based on the pressure sensitive signals received from the pressure sensitive keys to control operation of a software application executing outside the keyboard device body on the external host system device; and
   a keyboard controller within the keyboard device body and configured to receive the user configuration information including the granularity scales and/or including a selection among the granularity scales from an external device outside the keyboard device body that is input to the keyboard controller within the keyboard device body through the output communication interface, to store the received user configuration information for the pressure sensitive keys in the memory within the keyboard device body for later use by the keyboard controller, to receive the pressure sensitive signals from the pressure sensitive keys within the keyboard device body when depressed by a user, to use at least one of the granularity scales included within the stored user configuration information to generate keyboard output signals corresponding to the applied pressure levels of said at least one of the granularity scales based upon the pressure sensitive signals, and to output the keyboard output signals from the keyboard device body to the external host system outside of the keyboard device body through the output communication interface,
   wherein the keyboard controller further comprises a counter coupled to use a clock signal to generate a detected digital count based on a measurement of the pressure sensitive signals from each pressure sensitive key of the pressure sensitive keys, the digital count being utilized to represent an applied pressure level of the applied pressure levels to said each pressure sensitive key;
   wherein the keyboard controller is further configured to allow the user to enter specific values of minimum threshold and maximum threshold from the external device to create one or more personal configuration files and to store the minimum threshold and maximum threshold values provided by the user as part of the granularity scales for the pressure sensitive keys; and
   where the stored granularity scales further comprises a relationship between different values of the detected digital count and corresponding values of implied force that is defined to extend between the minimum threshold and maximum threshold; and where the minimum threshold is a minimum digital count level value from the counter that is required to generate the corresponding values of the implied force and where the maximum threshold is a maximum digital count level value from the counter that results in an increase in the corresponding values of the implied force.

2. The keyboard of claim 1, wherein each of the granularity scales further includes a given number of the applied pressure levels for a given pressure sensitive key that is different from each other of the granularity scales; and where the user configuration information allows for the granularity scales having different numbers of the applied pressure levels to be selected for different pressure sensitive keys.

3. The keyboard of claim 1, wherein the keyboard controller is further configured to allow the user to select one of the configuration files for use from outside the keyboard device body through the external device that is outside the keyboard device body.

4. The keyboard of claim 1, wherein the plurality of pressure sensitive keys comprise keys configured to produce a variable resistance signal or a variable capacitance signal when depressed by the user.

5. The keyboard of claim 1, wherein the plurality of pressure sensitive keys comprise keys are configured to produce a variable capacitance signal when depressed by the user; and wherein the keyboard controller further comprises the counter coupled to use the clock signal to generate the digital count based on the measurement of the capacitance signal, the digital count being utilized to represent pressure applied to the pressure sensitive keys.

6. The keyboard of claim 1, where after the user configuration information including the granularity scales is first received from the external device outside the keyboard device body through the output communication interface and stored in the memory, the keyboard controller is further configured to then receive additional second user configuration information through the output communication interface from the external device outside the keyboard device body to cause adjustment of the granularity scales of the user configuration information previously stored in the memory so as to change a sensitivity of the keyboard output signals that are generated based upon the pressure sensitive signals that are received from the pressure sensitive keys.

7. The keyboard of claim 1, where the keyboard controller is further configured to receive the pressure sensitive signals from said each of the pressure sensitive keys within the keyboard device body that are capacitance or resistance measurements representative of an amount of pressure applied to said each of the pressure sensitive keys; where each of the granularity scales includes a correlation of given measured capacitance or resistance to respective given of the applied pressure levels to be indicated for the pressure sensitive keys; and where the keyboard controller is further configured to:
- select the applied pressure level that correlates to each of the capacitance or resistance measurements,
- generate the keyboard output signals corresponding to each of the applied pressure levels selected from the granularity scales based upon the capacitance or resistance measurements, and
- communicate the keyboard output signals associated with the pressure sensitive keys from the keyboard device body to the external host system outside of the keyboard device body through the output communication interface.

8. The keyboard of claim 1, where the keyboard controller is further configured to store the user configuration information that categorizes each of the granularity scales by a particular corresponding video game or particular video game genre in the memory within the keyboard device body; where said each of the granularity scales further defines different game actions corresponding to different corresponding applied pressure levels to be indicated for the pressure sensitive keys based on the pressure sensitive signals received from the pressure sensitive keys; and where the keyboard controller is further configured to at least one of:
- simultaneously store in the memory within the keyboard device body the user configuration information that further comprises a first granularity scale configured for output to a first video game application that corresponds to a first user, and a second and different granularity scale for the same first video game application that corresponds to a second user; and
- simultaneously store in the memory within the keyboard device body the user configuration information that further comprises a first granularity scale configured for output to a first video game application, and a second and different granularity scale configured for output to a second video game application that is different than the first video game application.

9. A method for user control of a plurality of pressure sensitive keys for a keyboard, comprising:
- providing a keyboard device body having ft the plurality of pressure sensitive keys, memory, and a keyboard controller within the keyboard device body;
- coupling the keyboard device body to a separate external host system device outside of the keyboard device body through an output communication interface device to allow communication between the keyboard device body and the external host system through the output communication interface;
- receiving with the host system device user configuration information for the pressure sensitive keys, the user configuration information for the pressure sensitive keys including a plurality of granularity scales of multiple different applied pressure levels to be indicated from the keyboard device body to the external host system device outside the keyboard device body for the pressure sensitive keys based on pressure sensitive signals received from the pressure sensitive keys to control operation of a software application executing outside the keyboard device body on the external host system device and/or including a selection among the granularity scales of the applied pressure levels to be indicated to the external host system device for the pressure sensitive keys based on the pressure sensitive signals received from the pressure sensitive keys to control the operation of the software application executing outside the keyboard device body on the external host system device;
- sending the user configuration information including the granularity scales and/or including the selection among the granularity scales from the external host system outside of the keyboard device body to the keyboard controller within the keyboard device body through the output communication interface;
- using the keyboard controller within the keyboard device body to store the user configuration information including the granularity scales and/or including the selection among the granularity scales for later use within the memory within the keyboard device body in one or more configuration files;
- producing the pressure sensitive signals for the pressure sensitive keys when depressed by a user;
- using the keyboard controller within the keyboard device body to use the stored user configuration information within a configuration file of the configuration files including the granularity scales to generate keyboard output signals corresponding to the applied pressure levels of at least one of the granularity scales based upon the pressure sensitive signals; and
- using the keyboard controller within the keyboard device body to communicate the keyboard output signals associated with the pressure sensitive keys from the keyboard device body to the external host system outside of the keyboard device body through the output communication interface;
- wherein the producing step comprises producing a variable capacitance signal for each pressure sensitive key of the pressure sensitive keys when depressed by the user; and where the method further comprises:
- using a clock signal received in a counter to generate a digital count based on a measurement of the variable capacitance signal, the digital count being utilized to represent a corresponding pressure applied to said each of the pressure sensitive keys, and
- using the keyboard controller within the keyboard device body to allow the user to create one or more personal configuration files by receiving specific user-selected values of minimum threshold digital count and maximum threshold digital count input by the user from an external device outside the keyboard device body across the output communication interface to create the one or more personal configuration files and storing the user-selected values of the minimum threshold digital count and the maximum threshold digital count values as part of the granularity scales for the pressure sensitive keys; where the stored granularity scales further comprises a relationship between different values of detected digital count and corresponding values of implied force that is defined to extend between the user-selected values of the minimum threshold digital count value and the maximum threshold digital count value; and
- generating a value of the implied force only if the generated digital count value from the counter meets or exceeds the minimum threshold digital count value, and generating a constant maximum value of the implied force if the generated digital count value from the counter meets or exceeds the maximum threshold digital count value.

10. The method of claim 9, where the user configuration information includes the granularity scales; where each of the granularity scales includes a given number of the applied pressure levels for a given pressure sensitive key that is different from each other of the granularity scales; and where the method further comprises allowing the user to set different granularity scales for different pressure sensitive keys.

11. The method of claim 9, further comprising using the keyboard controller within the keyboard device body to store the configuration files on the keyboard and allowing the user to select one of the configuration files for use to control the operation of the software application executing outside the keyboard device body on the external host system device.

12. The method of claim 9, wherein the producing step further comprises producing the pressure sensitive signals based upon a variable resistance signal or the variable capacitance signal.

13. The method of claim 9, wherein the producing step further comprises producing the variable capacitance signal for said each of the pressure sensitive keys when depressed by the user; and where the method further comprises using the clock signal in the counter to generate the digital count based on a measurement of the variable capacitance signal, the digital count being utilized to represent pressure applied to said each of the pressure sensitive keys.

14. The method of claim 9, further comprising after storing the user configuration information including the granularity scales and/or including the selection among the granularity scales for later use in the memory within the keyboard device body; and then:
receiving with the host system additional user configuration information for the pressure sensitive keys, the additional user configuration information for the pressure sensitive keys including the granularity scales of the applied pressure levels to be indicated to the external host system device for the pressure sensitive keys based on the pressure sensitive signals received from the pressure sensitive keys and/or including the selection among the granularity scales of the applied pressure levels to be indicated for the pressure sensitive keys based on the pressure sensitive signals received from the pressure sensitive keys,
sending the additional user configuration information including the granularity scales and/or including the selection among the granularity scales from the external host system outside the keyboard device body to the keyboard controller within the keyboard device body through the output communication interface,
using the keyboard controller within the keyboard device body to store the additional user configuration information including the granularity scales and/or including the selection among the granularity scales for later use in the memory within the keyboard device body in the one or more configuration files, and
adjusting the granularity scales of the user configuration information previously stored in the memory within the keyboard device body so as to change a sensitivity of the keyboard output signals that are generated based upon the pressure sensitive signals that are received from the pressure sensitive keys.

15. The method of claim 9, further comprising:
receiving with the external host system device outside of the keyboard device body the user configuration information for the pressure sensitive keys, the user configuration information for the pressure sensitive keys including the granularity scales of the applied pressure levels to be indicated to the external host system device for the pressure sensitive keys based on the pressure sensitive signals received from the pressure sensitive keys;
sending the user configuration information including the granularity scales from the external host system device outside of the keyboard device body to the keyboard controller within the keyboard device body through the output communication interface;
using the keyboard controller within the keyboard device body to store the user configuration information including the granularity scales for later use in the memory on the keyboard in the one or more configuration files;
producing the pressure sensitive signals for the pressure sensitive keys when depressed by the user;
using the keyboard controller within the keyboard device body to use the stored user configuration information within the configuration file including the granularity scales to generate the keyboard output signals corresponding to one of the applied pressure levels of at least one of the granularity scales based upon the pressure sensitive signals; and
using the keyboard controller within the keyboard device body to communicate the keyboard output signals associated with the pressure sensitive keys to the external host system device through the output communication interface.

16. The method of claim 9, where the pressure sensitive signals produced and received from said each of the pressure sensitive keys are capacitance or resistance measurements that are representative of an amount of pressure applied to said each of the pressure sensitive keys; where each of the granularity scales includes a correlation of given measured capacitance or resistance to respective given of the applied pressure levels to be indicated for the pressure sensitive keys; and where the method further comprises using the keyboard controller within the keyboard device body to perform the following steps:
using the stored user configuration information within the configuration file including the granularity scales to select an applied pressure level that correlates to each of the capacitance or resistance measurements,
generating the keyboard output signals corresponding to each of the applied pressure levels selected from the granularity scales based upon the capacitance or resistance measurements, and
communicating the keyboard output signals associated with the pressure sensitive keys to the external host system device outside of the keyboard device body through the output communication interface.

17. The method of claim 9, further comprising using the keyboard controller within the keyboard device body to store in the memory within the keyboard device body the user configuration information in a manner that categorizes each of the granularity scales by a particular corresponding video game or video game genre; and where said each of the granularity scales further defines different game actions corresponding to different corresponding applied pressure levels to be indicated for the pressure sensitive keys based on the pressure sensitive signals received from the pressure sensitive keys; and further comprising using the keyboard controller within the keyboard device body to at least one of:

store in the memory within the keyboard device body the user configuration information including a first granularity scale configured for output to a first video game application that corresponds to a first user, and to separately and simultaneously store in the memory within the keyboard device body the user configuration information including a second and different granularity scale for the same first video game application that corresponds to a second user; and store in the memory within the keyboard device body the user configuration information including the first granularity scale configured for output to the first video game application, and to separately and simultaneously store in the memory within the keyboard device body the user configuration information including the second and different granularity scale configured for output to a second video game application that is different than the first video game application.

18. A keyboard having a plurality of user configurable pressure sensitive keys, comprising:

a keyboard device body including the plurality of pressure sensitive keys within the keyboard device body configured to provide pressure sensitive signals;

an output communication interface within the keyboard device body configured to be coupled to a separate external host system device outside of the keyboard device body to allow communication between the keyboard device body and the external host system through the output communication interface;

a memory within the keyboard device body configured to store one or more configuration files;

at least one configuration file of the one or more configuration files stored within the memory within the keyboard device body, the configuration file including user configuration information for the pressure sensitive keys including a plurality of granularity scales of multiple different applied pressure levels to be indicated from the keyboard device body to the external host system device outside the keyboard device body for the pressure sensitive keys based on the pressure sensitive signals received from the pressure sensitive keys to control operation of a software application executing outside the keyboard device body on the external host system device; and a keyboard controller within the keyboard device body and configured to receive the user configuration information including the plurality of granularity scales and/or including a selection among the plurality of granularity scales from an external device outside the keyboard device body that is input to the keyboard controller within the keyboard device body through the output communication interface, to store the received user configuration information for the pressure sensitive keys in the memory within the keyboard device body for later use by the keyboard controller, to receive the pressure sensitive signals from the pressure sensitive keys within the keyboard device body when depressed by a user, to use at least one of the granularity scales included within the stored user configuration information to generate keyboard output signals corresponding to the applied pressure levels of said at least one of the granularity scales based upon the pressure sensitive signals, and to communicate output of the keyboard output signals from the keyboard device body to the external host system outside of the keyboard device body through the output communication interface;

wherein the keyboard controller further comprises a counter coupled to use a clock signal to generate a detected digital count based on a measurement of the pressure sensitive signals from each pressure sensitive key of the pressure sensitive keys, the digital count being utilized to represent an applied pressure level of the applied pressure levels to said each pressure sensitive key;

wherein the keyboard controller is further configured to allow the user to enter specific values of minimum threshold and maximum threshold from the external device to create one or more personal configuration files and to store the minimum threshold and maximum threshold values that are provided by the user as part of the granularity scales for the pressure sensitive keys; and where the stored granularity scales further comprises a relationship between different values of the detected digital count and corresponding values of implied force that is defined to extend between the minimum threshold and maximum threshold; and where the minimum threshold is a minimum digital count level value from the counter that is required to generate the corresponding values of the implied force and where the maximum threshold is a maximum digital count level value from the counter that results in an increase in the corresponding values of the implied force.

* * * * *